US006496373B1

(12) United States Patent
Chung

(10) Patent No.: US 6,496,373 B1
(45) Date of Patent: Dec. 17, 2002

(54) COMPRESSIBLE THERMALLY-CONDUCTIVE INTERFACE

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 56 days.

(21) Appl. No.: 09/689,081

(22) Filed: Oct. 12, 2000

Related U.S. Application Data

(60) Provisional application No. 60/163,526, filed on Nov. 4, 1999.

(51) Int. Cl.$^7$ ................................................. H05K 7/20
(52) U.S. Cl. .................... 361/705; 156/306.6; 165/185; 174/16.3; 428/40.5
(58) Field of Search ................................ 361/700, 702, 361/704–706, 722, 708–712, 715–719; 165/80.3, 46, 185; 174/16.3; 257/706, 707, 713, 714, 720; 428/40.5, 41.3, 41.8, 220, 348, 349, 515; 156/306.6, 324.4, 247; 252/74; 524/399, 400, 404, 428

(56) References Cited

U.S. PATENT DOCUMENTS

| | | |
|---|---|---|
| 4,151,547 A | 4/1979 | Rhoades et al. |
| 4,258,100 A | 3/1981 | Fujitani et al. |
| 4,323,914 A | 4/1982 | Berndlmaier et al. |
| 4,548,862 A | 10/1985 | Hartman |
| 4,574,879 A | 3/1986 | DeGree et al. |
| 4,606,962 A | 8/1986 | Reylek et al. |
| 4,654,754 A | 3/1987 | Daszkowski |
| 4,782,893 A | 11/1988 | Thomas |
| 4,796,157 A | 1/1989 | Ostrem |
| 4,869,954 A | 9/1989 | Squitieri |
| 4,965,699 A | 10/1990 | Jorden et al. |
| 4,974,119 A | 11/1990 | Martin |
| 4,979,074 A | 12/1990 | Morley et al. |
| 5,014,777 A | 5/1991 | Sano |
| 5,194,480 A | 3/1993 | Block et al. |
| 5,213,868 A | 5/1993 | Liberty et al. |
| 5,298,791 A | 3/1994 | Liberty et al. |
| 5,781,412 A | 7/1998 | de Sorgo |
| 5,978,221 A | * 11/1999 | Sawa et al. .................. 361/704 |
| 6,054,198 A | 4/2000 | Bunyan et al. |

OTHER PUBLICATIONS

AI Technology Inc., Data Sheet, Cool–Bond CB7068–E, "Flexible down to –55° C. Instant Melt–bond @ 60° C. Insitu–Crosslinkable> 1000 V Insulation @ 3 mil Outstanding Thermal Conductivity", REV.A @ May 18, 1999, 1 page.

AI Technology Inc., Data Sheet, Cool–Pad CPR7155, "Non– curing Compressible Thermal Pad Flexible From –α to 150° C.", REV.B @ Aug. 31, 1999, 1 Page.

AI Technology Inc., Data Sheet, Cool–Bond CB7208–E, "In Situ "Curing" Pressure Sensitive Electrically Insulating Film Adhesive", REV. B @ Oct. 19, 1999, 1 Page.

(List continued on next page.)

Primary Examiner—Gerald Tolin
(74) Attorney, Agent, or Firm—Dann, Dorfman, Herrell & Skillman, P.C.

(57) ABSTRACT

A compressible and melt-flowable thermally conductive interface may be either tacky and pressure sensitive or be non-tacky and dry, and may include one of more thermally conductive fillers in one or more forms. The interface either melt flows or cures at low temperature, such as about 40–50° C. Certain embodiments provide a bond strength between a heat generating component, such as an integrated circuit, power transistor and the like, and a heat dissipating element, such as a heat sink or cold plate, sufficient to permit elimination of the need for mechanical fasteners.

39 Claims, 2 Drawing Sheets

U.S. PATENT DOCUMENTS

AI Technology Inc., Data Sheet, Cool–Pad TP7208–E, "Tacky Pressure Sensitive Electrically Insulating Film Adhesive", REV.1094/TP7208–E, 1 Page.

AI Technology Inc., Data Sheet, Thermoplastic TP7208–E, "In situ " Curing Pressure Sensitive Electrically Insulating Film Adhesive, REV. B @ Oct. 8, 1999, 1 Page.

AI Technology Inc., Data Sheet, Cool–Bond CB7208–EDA, "In situ "Curing" Pressure Sensitive Electrically Insulating Film Adhesive", REV. B @ Oct. 13, 1999, 1 Page.

AI Technology Inc., Data Sheet, Cool–Bond CB7258–E, "In situ Curing Pressure Sensitive Electrically Insulating Melt--Flow Film Pad High Compressibility", REV. B @ Nov. 4, 1999, 1 Page.

GM "Thermally–Conductive Adhesive Transfer Tapes 9882 . 9885 . 9890", Technical Data, Apr. 1999, pp. 1–6, St. Paul, MN.

Advanced Packaging, "Thermal Management Product Roundup", Advanced Packaging, May 1999, p. 54.

Gary Kuzmin and Mark Mellinger, "Putting The Chill On Hot Components", EP&P, Jun. 1999, 5 Pages, Thermalloy Inc., Dallas, TX.

Advanced Packaging, "Thermal Management Product Roundup", Nov.–Dec. 1998, pp. 70–71.

The Bergquist Company, "Thermal Solutions for Your Computers & Power Supplies", EP&P, 1 Page, Minneapolis, MN, Date Unknown.

Aavid Thermid Products, Inc., Cool–Covers For Rimm Modules, http://www.aavid.com/datashts/cool/covers.html, Oct. 6, 2000, pp. 1–4.

Chomerics, Technical Bulletin 70, "Therm–A–Gap Interface Materials Highly Conformable, Thermally Conductive Gap Fillers", © 1999, 6 pages.

Raychem Corporation, HeatPath GTQ R100, Thermal Interface Material For Direct Rambus Modules, May 1999, 2 Pages.

Raychem Corporation, HeatPath GTQ–HS2–R100, RIMM Module Heat Spreader Plate And Thermal Interface Material Assembly, May 1999, 2 Pages.

Raychem Corporation, HeatPath GTQ 1200 Series, Thin Interface Materials, Jan. 1999, 2 Pages.

Raychem Corporation, GTQ1500, HeathPath Thermal Interface Material, No Date, 2 Pages.

Raychem Corporation, HeatPath GTQ 1502, Thermal Interface Material, Aug. 1998, 2 Pages.

Raychem Corporation, HeatPath GTQ 1540, Thermal Interface Material, Apr. 1999, 2 Pages.

Raychem Corporation, GTQ 2100, HeatPath, Gap–Filler Thermal Interface Material, No Date, 2 Pages.

Raychem Corporation, HeatPath GTQ 2101, Gap–Filler Thermal Interface Material, No Date, 2 Pages.

Raychem Interconnect, HeatPath GTQ 2140, Gap Filler Thermal Interface Material, 1999, 2 Pages.

Raychem Corporation, HeatPath GTQ 2200 Series, Gap Filler Material, Jan. 1999, 2 Pages.

Raychem Corporation, GTQ 2500, HeatPath, Gap–Filler Thermal Interface Material, No Date, 2 Pages.

The Bergquist Company, "Gap Pad Conformable Thermal Interface", Advance Packaging, May 1998, p. 44.

Thermagon, Inc., "Interfact Pads", Advance Packaging, Nov./Dec., 1998, p. 26.

Thermoset Plastics, Inc., "We Make Your Chips Cool", 1 Page, Date Unknown.

Winphase, "Hang On, And Cool It", 1999, 1 Page.

Chipcollers, "A BGA Heat Sink Should Be Judged By How It Attaches To Your Chip", No. Date, 1 Page.

Johnson Matthey Electronics, "Packaging Material Solutions", No Date, 1 Page.

Raychem, "How To Keep A Notebook From Becoming A Cookbook", No Date, 1 Page.

\* cited by examiner

US 6,496,373 B1

COMPRESSIBLE THERMALLY-CONDUCTIVE INTERFACE

This Application claims the benefit of U.S. Provisional Application Ser. No. 60/163,526 filed Nov. 4, 1999.

The present invention relates to a thermal interface and, in particular, to a compressible thermally-conductive interface.

Management of the operating temperature of modern electronic components is often a substantial challenge in that as more and more functionality is provided in electronic components of seemingly ever-decreasing size, the removal of heat generated by such component becomes more difficult. In addition, these electronic components are being made to operate at faster operating rates which also increases the heat generated by such components. Thus, the problem of heat removal is compounded by the combined effects of smaller size and greater operating frequency.

Conventional approaches to removing heat from electronic components involve the transfer of the heat to a thermal dissipating element, such as a heat sink, cold plate or other suitable heat removal means. In the prior art arrangement of FIG. 1, for example, a semiconductor die 10, which produces heat when operating, is coupled to a heat sink or heat spreader 20, which dissipates heat aided by heat sink fins 22. Die 10 is mounted to a circuit board 12 and is connected thereby to external apparatus (not shown) by solder ball or pin connections 14. Typically, die 10 is protected by an encapsulant 16, such as a molded plastic. To provide a heat transfer path between die 10 and heat sink 20, an interface of a thermally-conductive material is placed between die 10 and heat sink 20, and the collection of die 10, circuit board 12, heat sink 20 and interface 24 are mechanically fastened and held together, such as by clamps or clips 30. Typical conventional interface pads 24 may be conformable to an irregularly-shaped component, but they are not compressible, which limits their utility.

Heat transfer is often aided if the interface pad 24 undergoes a phase change, i.e. melt flows, at suitably low temperature under the pressure of clamps 30, thereby to better conform and intimately contact the surfaces of the heat generating component 10 and of the heat dissipating elements 20. Such interface pads 24 have little or no bonding strength and so must be secured mechanically, as by clamps, clips and the like. Conductive interface pads such as type CP7508 available from AI Technology, Inc. of Princeton, N.J., will flex and melt-reflow at about 50° C. under normal clamping pressures, although they are not compressible and have little or no bonding strength to bond die 10 to heat sink 20. While the melting helps to eliminate trapped air spaces and voids between the two interfacing surfaces, even if some bonding strength develops after melt-reflow, that bonding strength drops essentially to zero each time the melt-reflow temperature is reached.

The lack of compressibility, low-temperature phase change and/or substantial bonding strength of conventional interface pads tends to limit their effectiveness and/or convenience of use in improving heat transfer across an interface. The need for mechanical clamps and fasteners can add as much as US$0.50–US$1.00 to the installed cost of a typical integrated circuit, such as a CPU for a computer.

While the conventional interface pads may work satisfactorily for a single component, such as a CPU chip, they are less effective for modules including plural components that can have a planarity tolerance of the heights of the various components as large as about 0.5 mm (about 20 mils) as illustrated in FIG. 2. A plurality of heat-generating and non-heat generating components 10 mounted to a circuit board or substrate 12 have top surfaces that are either at different heights or are tilted. Such differences in height arise, for example, from differences in the height of the components 10 and differences in their mounting to and placement on substrate 12. A conformable interface pad is flexible and so will tend to bend or drape across the differing height components 10, but is inherently incapable of being in intimate thermal contact with the heat sink 20 and both the taller and shorter components 10. A similar problem exists for a single component 10 that has an irregular or non-planar surface.

A compressible interface pad, if available, could accommodate such planarity tolerances. Prior art compressible interface materials include thermal greases and gels which are messy to use and require mechanical clips or clamps, and; elastomers that do not under go a phase change or melt-flow within the safe case operating temperatures of typical electronic components, and which often also require clips or clamps.

Accordingly, there is a need for a thermal interface material that provides the desirable characteristics of compressibility with a low temperature phase change or compressibility with low-temperature in situ curing to a substantial bonding strength.

To this end, the thermally conductive interface of the present invention comprises a blend of a compressible binder and at least one thermally conductive filler, wherein the compressible binder includes one of (a) a mixture of a thermoplastic rubber and a thermoplastic pressure sensitive adhesive, (b) a mixture of an epoxy blend and a curing agent for curing at less than 75° C. and a thermoplastic pressure sensitive adhesive and (c) a mixture of an epoxy blend and a curing agent for curing at less than 75° C. and a thermoplastic rubber or elastomer.

BRIEF DESCRIPTION OF THE DRAWING

The detailed description of the preferred embodiments of the present invention will be more easily and better understood when read in conjunction with the FIGURES of the Drawing which include.

Figure 1:
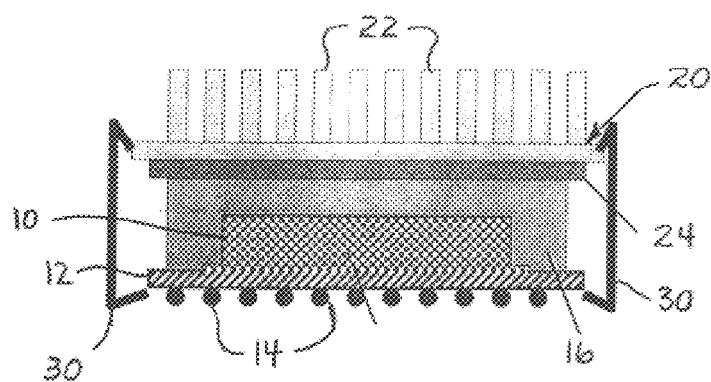
FIGS. 1 and 2 are side view schematic diagrams of conventional prior art heat sinking arrangements for a single heat-generating component and for plural components, respectively.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. It is noted that, according to common practice, the various features of the drawing are not to scale, and the dimensions of the various features are arbitrarily expanded or reduced for clarity.

DESCRIPTION OF THE PREFERRED EMBODIMENTS

Figure 2:
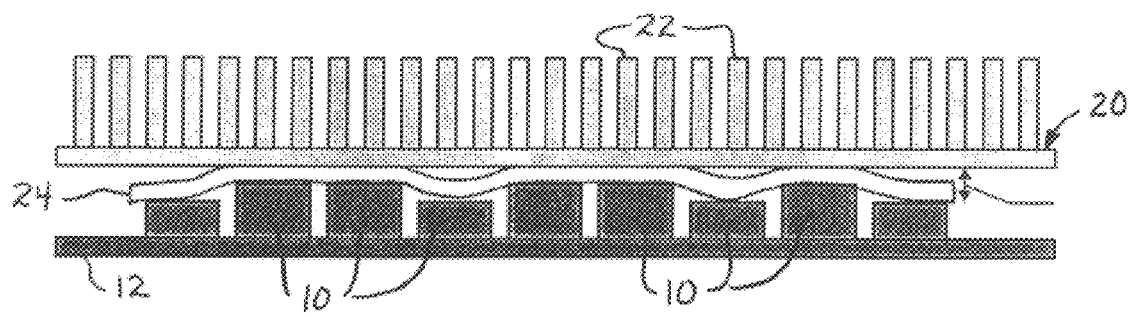

The prior art thermal interface arrangements of FIGS. 1 and 2 are as described above and have the problems and shortcomings there described. What is needed to overcome these shortcomings is a thermal interface pad that is either compressible with a phase change at a melt-flow temperature within the operating temperature range of the electrical heat-generating components with which it is to be utilized or is compressible with low-temperature in situ curing to a substantial bonding strength within that same temperature range.

As used herein, an interface material is compressible if its thickness decreases by at least 10% under a pressure of 20 psi (about 1.4 kg/cm$^2$) at room temperature, about 25° C. A more desirable compressible material will decrease in thickness by at least 20% under 20 psi (about 1.4 kg/cm$^2$) pressure, and a preferable interface material will decrease in thickness by at least 30% under 10 psi (about 0.7 kg/cm$^2$) pressure. Typically, a compressible interface material will exhibit a hardness (Shore A) of about 60 or less.

Figure 3:
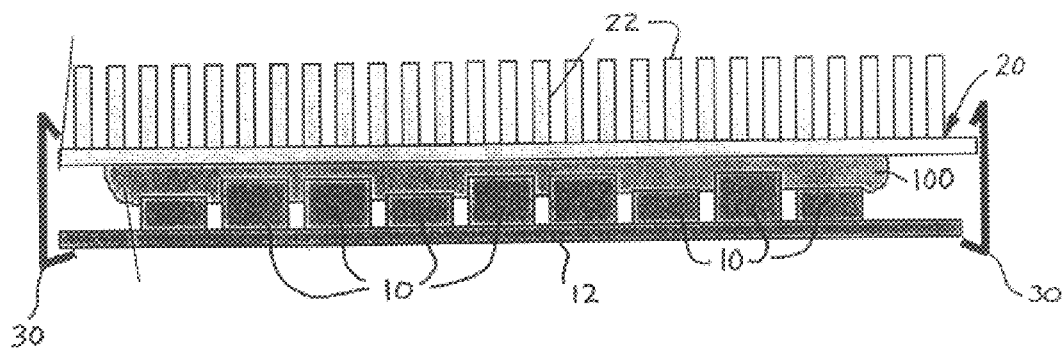
FIG. 3 is a side view schematic diagram of a heat sinking arrangement for plural heat-generating components employing an exemplary embodiment of a compressible, melt-flowable thermal interface according to the invention.

FIG. 3 is a side view schematic diagram of a heat dissipating arrangement for plural heat-generating components 10 employing an exemplary embodiment of a compressible, melt-flowable thermal interface 100 according to the invention. One or more electrical heat-generating components 10, such as integrated circuits, transistors, power transistors, diodes and power diodes, transformers and inductors, resistors, and the like, are mounted to an electrical circuit substrate 12 of conventional material and construction. Efficient removal of heat therefrom becomes of greater importance as the power dissipated in the component(s) increases, particularly where the power is about 1 watt, or more, such as in a microprocessor operating at a high frequency or in a power component such as a transistor. These component(s) typically are of different heights due to differences in component height, mounting type and tilt, and configuration, as well as the tolerances on each of these foregoing. Such height differences or "co-planarity" make a low thermal resistance (high thermal conductance) heat conducting path to a heat dissipating element, such as a finned 22 heat sink 20, as illustrated in FIG. 4, difficult to achieve.

Figure 4:
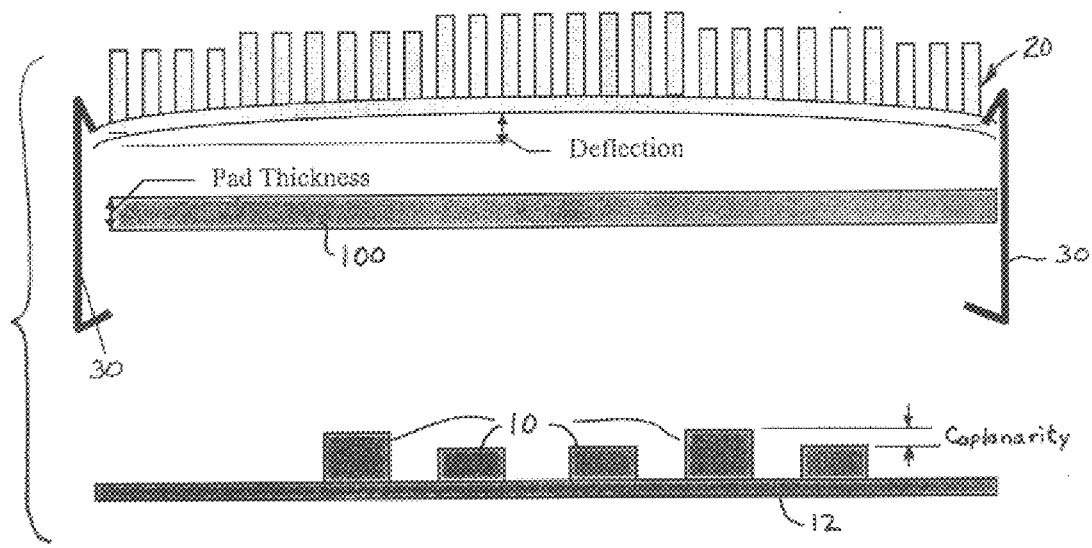
FIG. 4 is a side view schematic diagram illustrating the typical sources of tolerances that can be accommodated by the compressible, melt-flowable thermal interface according to the invention.

FIG. 4 is a side view schematic diagram illustrating the typical sources of tolerances that can be accommodated by the compressible, melt-flowable thermal interface 100 according to the invention. In addition to the height variation of components 10, which is typically as much as 20 mils (about 0.5 mm) or more, heat sink 20 is typically not planar, for example, due to tolerances in manufacture and/or distortion due to stress. In addition, and possibly beneficially, heat dissipating element 20 may deflect when clamped to a components 10 and substrate 12 by clamps, clips or other mechanical fasteners 30. The total of these sources of non-planarity can typically produce a total tolerance in excess of 10 mils (about 0.25 mm). In the case of a total co-planarity tolerance of 10 mils (about 0.25 mm), thermal interface 100 should be at least 10 mils (about 0.25 mm) thick, and, preferably, heat dissipating element 20 will undergo deflection of about 10 mils (about 0.25 mm) when tightly clamped over those of components 10 in need of having heat removed. Often, tightly clamping heat sink 20 at or near its edges provides such deflection.

Compressible thermal interface pad 100, because it is compressible, is able to compress and so adjust in thickness to compensate for substantial co-planarity of components 10 and the deflection of heat sink 20, typically to take up most of the co-planarity and deflection of components 10 and heat dissipating element 20, when of an appropriate thickness. Interface pad 100 is also melt flowable at a temperature within the normal operating range of most heat-generating electronic components 10, i.e. the material softens and melts so as to flow to fill voids and/or release trapped air and to better adjust to the variations in spacing between components 10 and heat sink 20, thereby to accommodate the remainder of the co-planarity and deflection of components 10 and heat dissipating element 20. In addition, thermal interface pad 100 is also either a pressure-sensitive adhesive or is heat-curable in situ within the normal operating temperature range of heat-generating components 10, or both.

The melt flowing of compressible thermally-conductive interface 100 combined with the compressibility thereof is sufficient to take up all of the co-planarity planarity and deflection of components 10 and heat sink 20 if interface 100 has a thickness that is greater than such co-planarity and deflection. Typically, compressible thermally-conductive interface 100 is provided in a thin sheet or in a roll, or as a pre-punched or kiss-cut preform, having a thickness of, e.g., 3, 6, 10, 20 or 40 mils (about 75, 150, 250, 500 or 1000 μm) or other desired thickness.

Embodiment 1. A first exemplary compressible, melt-flowable thermal interface pad 100 has pressure-sensitive adhesive ("tacky") qualities that make it easy to attach to heat dissipating element 20 and/or components 10. Such interface 100 preferably melt flows at a temperature in the range of about 40–55° C., which is a temperature commonly reached by many electronic components either upon being powered up or operated in a normal manner or in the assembly processing, and not above about 70–75° C. As a result of the high melt flowability, such interface typically has low shear strength and so heat dissipating element 20 must be held to substrate 12 or component(s) 10 by a mechanical fastener such as clamps, clips, screws, nuts and bolts and the like. Such interface material typically comprises between 10 and 40 parts by weight of a tacky binder and between 90 and 60 parts by weight of thermally conductive filler particles. Typical thermally conductive filler materials include aluminum, alumina, aluminum nitride, boron nitride, copper, diamond-like carbon, silicon carbide, silver, and the like, in crystallite, flake, particulate, spherical, or other suitable form. The tacky binder is typically between 25 and 50 parts by weight of a tacky elastomer, such as silicone gum or poly-ethylene-based gum, between 0 and 25 parts by weight of a thermoplastic rubber and between 75 and 50 parts by weight of a wax, such as a paraffinic wax, wherein the tacky elastomer and the thermoplastic rubber are soluble in the same solvent.

An example of such interface is type CPR7155 COOL-PAD™ compressible thermal interface that is non-curing and is flexible over the temperature range of −60 to +150° C. available from AI Technology, Inc. located in Princeton, N.J. CPR7155 comprises about 20 parts by weight of tacky binder and about 80 parts by weight of alumina crystallite thermally conductive filler. The tacky binder comprises about 50 parts by weight of paraffinic wax and 50 parts by weight of tacky elastomer, both of which are soluble in mineral spirits. CPR7155 melt flows at about 45° C. and is compressible to about 30% under a pressure of 20 psi (about 1.4 kg/cm$^2$).

An electronic assembly including the foregoing interface pad 100 comprises at least one electronic device capable of dissipating at least 1 watt during operation and a heat dissipating device adapted for receiving heat from the at least one electronic device. Melt flowable thermally conductive interface pad 100 is disposed between the electronic device and the heat dissipating device and in contact therewith, wherein the thermally conductive interface pad is compressible by at least ten percent (10%) at a temperature of about 25° C. and melt flowable at a temperature between 40° C. and 80° C., under a pressure of 5 psi or greater. At least one fastener is employed for causing at least the 5 psi pressure between the electronic device and the heat dissipating device. The melt flowable thermally conductive interface pad is compressible by at least twenty percent (20%), and preferably by at least thirty percent (30%), at a temperature of about 25° C. under a pressure of 5–20 psi. In addition, the melt flowable thermally conductive interface pad is compressible by at least twenty percent (20%) and melt flowable at a temperature between 40° C. and 80° C., under a pressure of 5 psi or greater.

Embodiment 2. A second exemplary compressible, melt-flowable thermal interface pad 100 also has pressure-sensitive adhesive qualities that make it easy to attach to heat dissipating element 20 and/or components 10, and also "cures in use" or "in situ" so as to have a substantial bond strength, whereby bond strength is maintained even if the melt-flow temperature is reached and so mechanical fasteners are not necessary. Such interface 100 includes thermosetting material that cures at a temperature in the range of about 40–75° C., and preferably between about 40–55° C., which is a temperature commonly reached by many electronic components either upon being powered up or operated in a normal manner or in the assembly processing, and not above about 75–80° C. As a result, before activation of curing of the material of interface 100, interface 100 is compressible and melt flowable, but after the temperature at which curing is activated is reached, the thermosetting polymer forms cross-links so that substantial bonding strength to components 10 and heat sink 20 is provided and will be maintained even if the melt flow temperature is reached after curing. A bond strength as applied of at least 20–50 psi (about 1.4–3.5 kg/cm$^2$) is provided, which bond strength increases to at least 100 psi (about 7 kg/cm$^2$) after curing, and preferably 300 psi (about 21 kg/cm$^2$), when pushed off from the side, i.e. shear strength. As a result, such interface may be utilized without the need for mechanical fasteners, thereby beneficially reducing the cost of needed components, as well as the time and cost of assembly.

Such interface material typically comprises between 10 and 40 parts by weight of a tacky low-temperature (in situ) curable binder and between 90 and 60 parts by weight of thermally conductive filler particles. Typical thermally conductive filler materials include aluminum, alumina, aluminum nitride, boron nitride, copper, diamond-like carbon, silicon carbide, silver, and the like, in crystallite, flake, particulate, spherical, or other suitable form. The tacky low-temperature curable binder is typically between 10 and 90 parts by weight of a tacky thermoplastic pressure sensitive adhesive and between 90 and 10 parts by weight of an epoxy blend that cures at a temperature less than 75–80° C., but preferably at least about 40–60° C. so that it can be stored for a reasonable time at 25° C., wherein the tacky thermoplastic and the epoxy blend are "compatible" in that they are soluble in the same solvent.

One example of such in situ curable interface is type CPR7258-E COOL-BOND™ compressible pressure sensitive thermal interface that cures in situ at a temperature range of about 40–45° C., also available from AI Technology, Inc. CPR7258-E comprises about 20 parts by weight of tacky pressure sensitive in-situ-curable binder and about 80 parts by weight of aluminum nitride thermally conductive filler. The tacky curable binder comprises about 90–50 parts by weight of tacky pressure sensitive thermoplastic and 10–50 parts by weight of an epoxy blend that cures at a temperature of about 45° C. or above, both soluble in methyl-ethyl-ketone (MEK). The curing agent is selected so as to not cure too rapidly at 25° C. so that a suitable period of storage is available. CPR7258-E as applied provides at least 50 psi (about 0.35 kg/cm$^2$) push-off strength which increases to more than 300 psi (about 2.1 kg/cm$^2$). CPR7258-E melt flows at about 60° C. and is compressible to about 30% under a pressure of 20 psi (about 1.4 kg/cm$^2$).

Another example of such in situ curable interface is type CB7208-EDA COOL-BOND™ compressible pressure sensitive thermal interface that cures in situ at a temperature range of about 40–45° C., also available from AI Technology, Inc. CB7208-EDA comprises about 20 parts by weight of tacky pressure sensitive in-situ-curable binder and about 80 parts by weight of aluminum nitride thermally conductive filler. The tacky curable binder comprises about 70 parts by weight of tacky pressure sensitive thermoplastic and 30 parts by weight of an epoxy blend that cures at a temperature of about 45° C. or above, both soluble in MEK. The curing agent is selected so as to not cure too rapidly at 25° C. so that a suitable period of storage is available. CB7208-EDA as applied provides at least 50 psi (about 0.35 kg/cm$^2$) push-off strength which increases to more than 300 psi (about 2.1 kg/cm$^2$). CPR7208-EDA melt flows at about 60° C. and is compressible to about 30% under a pressure of 20 psi (about 1.4 kg/cm$^2$).

Even though the pressure sensitive adhesive properties of the foregoing compressible thermally-conductive interface pads is adequate to secure bond the heat-generating element to a heat-dissipating element immediately upon placement, it is advantageous that they be placed with a pressure of at least 5 psi (about 0.35 kg/cm$^2$) at an elevated temperature, e.g., 80–100° C., thereby to obtain the benefit of both the compressibility and the melt flow characteristics to better reduce and/or eliminate trapped air and/or voids between the heat-generating element and the heat-dissipating element. Curing may then proceed at a temperature above about 40° C. without continued application of pressure, either by applying heat or by placing the heat-generating element in use wherein the temperature rise of the element will provide adequate heat, i.e. for "curing in use" or "in-situ" curing. Even if the thermal interface does not reach 40° C. and cure further, the as-applied bond strength in excess of 50 psi (about 3.5 kg/cm$^2$), and typically 100 psi (about 7 kg/cm$^2$) or more, is usually sufficient to secure the heat-dissipating element to the heat-generating element.

An electronic assembly including the foregoing thermally conductive interface pad 100 comprises at least one electronic device capable of dissipating at least 1 watt during operation, a heat dissipating device adapted for receiving heat from said at least one electronic device, and an in situ curable thermally conductive interface pad disposed between the electronic device and the heat dissipating device and in contact therewith. The in situ curable thermally conductive interface pad is (i) compressible by at least ten percent (10%) at a temperature of about 25° C. under a pressure of 5 psi or greater, (ii) provides a bond strength of at least 50 psi immediately upon placement under a pressure of 5 psi or greater, and (iii) cures in situ at a temperature between 40° C. and 80° C. to provide a cured bond strength of at least 300 psi. The in situ curable thermally conductive interface pad provides a bond strength of at least 100 psi immediately upon placement under a pressure between 5 psi and 50 psi and cures in situ at a temperature less than 75° C. to provide a cured bond strength of at least 100 psi at a temperature of 85° C. Typically, the in situ curable thermally conductive interface pad provides a cured bond strength of at least 500 psi at a temperature of 25° C. and of at least 100 psi at a temperature of 85° C. In such electronic assembly, the heat dissipating device may be attached to the electronic device solely by the in situ curable thermally conductive interface pad, without a mechanical fastener, and the temperature between 40° C. and 80° C. for in situ curing is typically produced by operation of the electronic device.

Embodiment 3. A third exemplary compressible, melt-flowable thermal interface pad 100 that is dry or non-tacky so as to be easily handled and attach to heat dissipating element 20 and/or components 10, also "cures in use" or in situ so as to have a substantial bond strength, whereby bond strength is maintained even if the melt-flow temperature is reached and so mechanical fasteners are not necessary. Such interface 100 includes thermosetting material and a solid state curing agent that preferably is activated to initiate curing at a temperature in the range of about 40–55° C., which is a temperature commonly reached by many electronic components either upon being powered up or operated in a normal manner or in the assembly processing, and not above about 75–80° C. As a result, before activation of the solid state curing agent of the material of interface 100, interface 100 is compressible and melt flowable and does not cure, thereby allowing storage for a reasonably long time, e.g., one year.

The thermally-conductive interface may be assembled between an heat-generating element and a heat-dissipating element in its room-temperature, dry state or may be assembled by the application of heat and pressure sufficient to melt flowing. After the temperature at which the curing agent is activated is reached, as it is when the thermally-conductive interface is heated to its melt-flow temperature during assembly, the thermosetting polymer forms cross-links so that substantial bonding strength to components 10 and heat sink 20 is provided and will be maintained even if the melt flow temperature is reached after curing. A bond strength as applied with melt flowing of at least 50 psi (about 3.5 kg/cm$^2$) is provided, which bond strength increases to at least 100 psi (about 7 kg/cm$^2$) after curing, and preferably 300 psi (about 21 kg/cm$^2$), when pushed off from the side, i.e. shear strength. As a result, such interface, once applied, may be utilized without the need for mechanical fasteners, thereby beneficially reducing the cost of needed components, as well as the time and cost of assembly.

Such interface material typically comprises between 10 and 40 parts by weight of a dry, non-tacky, low-temperature (in situ) curable binder and between 90 and 60 parts by weight of thermally conductive filler particles. Typical thermally conductive filler materials include aluminum, alumina, aluminum nitride, boron nitride, copper, diamond-like carbon, silicon carbide, silver, and the like, in crystallite, flake, particulate, spherical, or other suitable form. The non-tacky low-temperature curable binder is typically between 50 and 90 parts by weight of a thermoplastic rubber or elastomer and between 50 and 10 parts by weight of an epoxy blend, and with suitable amount of a solid state curing agent that activates at a temperature less than the melt-flow temperature of the thermoplastic rubber/elastomer, such as about 5–25 parts by weight per hundred parts of the epoxy blend. Preferably, the curing agent activates at a temperature of at least about 40–60° C. so that it can be stored for a reasonable time at 25° C., wherein the thermoplastic rubber/elastomer and the epoxy blend are "compatible" in that they are soluble in the same solvent. Type CB7068-E interface available from AI Technology is one such compressible, melt-flowable, in situ curing interface.

Another example of such in situ curable interface is type CP7135-E compressible dry thermal interface that cures in situ at a temperature range of about 40–45° C., also available from AI Technology, Inc. CP7135-E comprises about 20 parts by weight of non-tacky in-situ-curable binder and about 80 parts by weight of alumina crystallite thermally conductive filler. The non-tacky curable binder comprises about 50 parts by weight of thermoplastic such as a rubber or elastomer, about 50 parts by weight of an epoxy blend that cures at a temperature of about 45° C. or above, both soluble in MEK. In addition, about 5–25 parts by weight per hundred parts epoxy resin of a solid state curing agent that melts and activates at a temperature of about 45° C. The curing agent is selected so as to not activate at too low a temperature so that a reasonably long period of storage is available.

CP7135-E compressible thermally conductive interface is preferably applied at a temperature of 110–150° C. to induce melt flow so as to reduce and/or eliminate voids and/or trapped gas and, if to be utilized without mechanical fasteners, is preferably applied at a temperature of 120–150° C. under a pressure of at least 5 psi (about 0.35 kg/cm$^2$). CP7135-E so applied provides at least 300 psi (about 2.1 kg/cm$^2$) push-off strength which increases to a cure bond strength of more than 1000 psi (about 70 kg/cm$^2$), and will maintain bonding up to about 90° C. even if curing is incomplete and will maintain bonding strength up to about 150° C. if greater than 50% cured. CP7135-E is compressible to about 30% under a pressure of 20 psi (about 1.4 kg/cm$^2$).

An electronic assembly including the foregoing thermally conductive interface pad 100 comprises at least one electronic device capable of dissipating at least 1 watt during operation, a heat dissipating device adapted for receiving heat from the at least one electronic device, and an in situ curable thermally conductive interface pad disposed between the electronic device and the heat dissipating device and in contact therewith. The in situ curable thermally conductive interface pad (i) is compressible by at least ten percent (10%), (ii) melt flows at a given temperature between about 40–125° C. under a pressure of 5 psi or greater, (iii) provides a bond strength of at least 50 psi immediately upon placement under a pressure of 5 psi or greater, and (iv) initiates curing in situ when raised to a temperature not less than 40° C. to provide a cured bond strength of at least 300 psi. The in situ curable thermally conductive interface pad provides a bond strength of at least 100 psi immediately upon placement at a temperature between 60–125° C. under a pressure between 5 psi and 50 psi and cures in situ at a temperature less than 75° C. to provide a cured bond strength of at least 100 psi at a temperature of 85° C. Typically, the heat dissipating device is attached to the electronic device solely by the in situ curable thermally conductive interface pad, without a mechanical fastener, and the temperature between 40° C. and 80° C. for in situ curing is produced by operation of the electronic device.

The compressible and melt flowable thermally conductive interface pad or sheet herein has a bulk thermal conductivity of not less than 1.0 watt/m-° C. A 20-mil (about 0.5 mm) thick interface pad typically exhibits a temperature rise of no more than 0.5° C./watt-square inch when measured between two aluminum surfaces.

While the present invention has been described in terms of the foregoing exemplary embodiments, variations within the scope and spirit of the present invention as defined by the claims following will be apparent to those skilled in the art. For example, the formulations of the tacky and non-tacky binders may include greater or lesser amounts of the principal constituents and may also include other constituents such as dyes and coloring agents, plural and different solvents, and the like, while still providing the compressible and/or melt flowability of the inventive interface.

What is claimed is:

1. A compressible and melt-flowable thermally conductive interface comprising:
    at least one heat generating element;
    a heat dissipating element adapted for receiving heat from said at least one heat generating element;
    a compressible and melt flowable thermally conductive interface pad or sheet disposed between said heat generating element and said heat dissipating element and in contact therewith, said thermally conductive interface pad or sheet comprising a blend of a compressible and melt flowable binder and at least one thermally conductive filler,
    wherein said compressible and melt flowable binder includes one of (a) a mixture of a thermoplastic rubber and a compatible thermoplastic pressure sensitive adhesive, and a wax, melt flowable at less than 75° C., (b) a mixture of an epoxy blend and a curing agent for curing at less than 75° C. and a compatible thermoplastic pressure sensitive adhesive and (c) a mixture of an epoxy blend and a curing agent for curing at less than 75° C. and a compatible thermoplastic rubber or elastomer.

2. The thermally conductive interface of claim 1 wherein said compressible and melt flowable thermally conductive interface pad or sheet is compressible at least ten percent (10%) under a pressure of 20 psi.

3. The thermally conductive interface of claim 2 wherein said compressible and melt flowable thermally conductive interface pad or sheet is compressible at least twenty percent (20%) under a pressure of 20 psi.

4. The thermally conductive interface of claim 2 wherein said compressible and melt flowable thermally conductive interface pad or sheet is compressible about thirty percent (30%) under a pressure of 10 psi.

5. The thermally conductive interface of claim 1 wherein said compressible and melt flowable thermally conductive interface pad or sheet is melt flowable at a temperature between 40° C. and 125° C.

6. The thermally conductive interface of claim 1 wherein said compressible and melt flowable thermally conductive interface pad or sheet cures to a bonding strength of at least 300 psi.

7. The thermally conductive interface of claim 1 wherein said compressible and melt flowable thermally conductive interface pad or sheet is pressure sensitive having a bond strength of at least 20 psi as applied and curing to a bond strength of at least 300 psi.

8. The thermally conductive interface of claim 7 wherein said compressible and melt flowable thermally conductive interface pad or sheet is curable at a temperature between 40° C. and 75° C.

9. The thermally conductive interface of claim 1 wherein said compressible and melt flowable thermally conductive interface pad or sheet has a bulk thermal conductivity of not less than 1.0 watt/m-° C.

10. The thermally conductive interface of claim 1 wherein said curing agent is a solid state curing agent that is activated by increasing its temperature to above 40° C.

11. The thermally conductive interface of claim 1 wherein said at least one heat generating element includes a plurality of electronic components mounted to a substrate and having a co-planarity of 0.02 inch or less.

12. A compressible and melt flowable thermally conductive interface pad or sheet comprising a blend of a compressible and melt flowable binder and at least one thermally conductive filler, wherein said compressible and melt flowable binder includes one of (a) a mixture of a thermoplastic rubber and a compatible thermoplastic pressure sensitive adhesive, (b) a mixture of an epoxy blend and a curing agent for curing at less than 75° C. and a compatible thermoplastic pressure sensitive adhesive and (c) a mixture of an epoxy blend and a curing agent for curing at less than 75° C. and a compatible thermoplastic rubber or elastomer.

13. The thermally conductive interface of claim 12 wherein said compressible thermally conductive interface pad or sheet is compressible at least ten percent (10%) under a pressure of 20 psi.

14. The thermally conductive interface of claim 13 wherein said compressible thermally conductive interface pad or sheet is compressible at least twenty percent (20%) under a pressure of 20 psi.

15. The thermally conductive interface of claim 13 wherein said compressible thermally conductive interface pad or sheet is compressible about thirty percent (30%) under a pressure of 10 psi.

16. The thermally conductive interface of claim 12 wherein said compressible thermally conductive interface pad or sheet is melt flowable at a temperature between 40° C. and 125° C.

17. The thermally conductive interface of claim 12 wherein said compressible thermally conductive interface pad or sheet cures to a bonding strength of at least 300 psi.

18. The thermally conductive interface of claim 12 wherein said compressible thermally conductive interface pad or sheet is pressure sensitive having a bond strength of at least 20 psi as applied and curing to a bond strength of at least 300 psi.

19. The thermally conductive interface of claim 18 wherein said compressible thermally conductive interface pad or sheet is curable at a temperature between 40° C. and 75° C.

20. The thermally conductive interface of claim 13 wherein said compressible thermally conductive interface pad or sheet has a bulk thermal conductivity of not less than 1.0 watt/m-° C.

21. The thermally conductive interface of claim 12 in combination with at least one heat generating element including a plurality of electronic components mounted to a substrate and having a co-planarity of 0.02 inch or less.

22. An electronic assembly comprising:
    at least one electronic device capable of dissipating at least 1 watt during operation;
    a heat dissipating device adapted for receiving heat from said at least one electronic device;
    a compressible and melt flowable thermally conductive interface pad disposed between said electronic device and said heat dissipating device and in contact therewith, wherein said thermally conductive interface pad is compressible by at least ten percent (10%) at a temperature of about 25° C. and melt flowable at a temperature between 40° C. and 80° C., under a pressure of 5 psi or greater;. and
    at least one fastener for causing at least the 5 psi pressure between :said electronic device and said heat dissipating device.

23. The electronic assembly of claim 22 wherein said melt flowable thermally conductive interface pad is compressible by at least twenty percent (20%) at a temperature of about 25° C. under a pressure of 5–20 psi.

24. The electronic assembly of claim 23 wherein said melt flowable thermally conductive interface pad is compressible by at least thirty percent (30%) at a temperature of about 25° C. under a pressure of 5–20 psi.

25. The electronic assembly of claim 22 wherein said melt flowable thermally conductive interface pad is compressible by at least twenty percent (20%) and melt flowable at a temperature between 40° C. and 80° C., under a pressure of 5 psi or greater.

26. An electronic assembly comprising:
- at least one electronic device capable of dissipating at least 1 watt during operation;
- a heat dissipating device adapted for receiving heat from said at least one electronic device;
- an in situ curable thermally conductive interface pad disposed between said electronic device and said heat dissipating device and in contact therewith, wherein said in situ curable thermally conductive interface pad is (i) compressible by at least ten percent (10%) at a temperature of about 25° C. under a pressure of 5 psi or greater, (ii) provides a bond strength of at least 50 psi immediately upon placement under a pressure of 5 psi or greater, and (iii) cures in situ at a temperature between 40° C. and 80° C. to provide a cured bond strength of at least 300 psi.

27. The electronic assembly of claim 26 wherein said in situ curable thermally conductive interface pad provides a bond strength of at least 100 psi immediately upon placement under a pressure between 5 psi and 50 psi.

28. The electronic assembly of claim 26 wherein said in situ curable thermally conductive interface pad is compressible by at least thirty percent (30%) at a temperature of about 25° C. under a pressure of 5–20 psi.

29. The electronic assembly of claim 26 wherein said in situ curable thermally conductive interface pad cures in situ at a temperature less than 75° C. to provide a cured bond strength of at least 100 psi at a temperature of 85° C.

30. The electronic assembly of claim 26 wherein said in situ curable thermally conductive interface pad cures in situ at a temperature less than 75° C. to provide a cured bond strength of at least 500 psi at a temperature of 25° C. and of at least 100 psi at a temperature of 85° C.

31. The electronic assembly of claim 26 wherein said heat dissipating device is attached to said electronic device solely by said in situ curable thermally conductive interface pad.

32. The electronic assembly of claim 26 wherein the temperature between 40° C. and 80° C. for in situ curing is produced by operation of said electronic device.

33. An electronic assembly comprising:
- at least one electronic device capable of dissipating at least 1 watt during operation;
- a heat dissipating device adapted for receiving heat from said at least one electronic device;
- an in situ curable thermally conductive interface pad disposed between said electronic device and said heat dissipating device and in contact therewith, wherein said in situ curable thermally conductive interface pad (i) is compressible by at least ten percent (10%), (ii) melt flows at a given temperature between about 40–125° C. under a pressure of 5 psi or greater, (iii) provides a bond strength of at least 50 psi immediately upon placement under a pressure of 5 psi or greater, and (iv) initiates curing in situ when raised to a temperature not less than 40° C. to provide a cured bond strength of at least 300 psi.

34. The electronic assembly of claim 33 wherein said in situ curable thermally conductive interface pad provides a bond strength of at least 100 psi immediately upon placement at a temperature between 60–125° C. under a pressure between 5 psi and 50 psi.

35. The electronic assembly of claim 33 wherein said in situ curable thermally conductive interface pad cures in situ at a temperature less than 75° C. to provide a cured bond strength of at least 100 psi at a temperature of 85° C.

36. The electronic assembly of claim 33 wherein said heat dissipating device is attached to said electronic device solely by said in situ curable thermally conductive interface pad.

37. The electronic assembly of claim 33 wherein the temperature between 40° C. and 80° C. for in situ curing is produced by operation of said electronic device.

38. A compressible thermally conductive interface pad or sheet comprising a blend of a compressible binder and at least one thermally conductive filler, wherein said compressible binder includes a mixture of a thermoplastic rubber and a thermoplastic pressure sensitive adhesive, wherein said mixture of a thermoplastic rubber and a thermoplastic pressure sensitive adhesive further comprises a wax melt flowable at less than 75° C.

39. A compressible thermally conductive interface pad or sheet comprising a blend of a compressible binder and at least one thermally conductive filler, wherein said compressible binder includes one of:
- (a) a mixture of an epoxy blend and a curing agent for curing at less than 75° C. and a thermoplastic pressure sensitive adhesive and
- (b) a mixture of an epoxy blend and a curing agent for curing at less than 75° C. and a thermoplastic rubber or elastomer, wherein said curing agent is a solid state curing agent that is activated by increasing its temperature to above 40° C.

* * * * *